United States Patent
Hu et al.

(10) Patent No.: US 8,453,916 B2
(45) Date of Patent: Jun. 4, 2013

(54) THERMAL CONDUCTION DEVICE AND METHOD FOR FABRICATING THE SAME

(75) Inventors: Shao-Chung Hu, Taipei County (TW); Hsing Hung, Taipei County (TW); Hung-Cheng Lin, Taipei County (TW); I-Chiao Lin, Taipei (TW); Chien-Min Sung, Taipei County (TW)

(73) Assignee: Ritedia Corporation, Hsinchu (TW)

( * ) Notice: Subject to any disclaimer, the term of this patent is extended or adjusted under 35 U.S.C. 154(b) by 137 days.

(21) Appl. No.: 13/004,437

(22) Filed: Jan. 11, 2011

(65) Prior Publication Data

US 2012/0114932 A1  May 10, 2012

(30) Foreign Application Priority Data

Nov. 4, 2010 (TW) ............................. 99137898 A

(51) Int. Cl.
*B23K 31/02* (2006.01)
*B22F 7/00* (2006.01)

(52) U.S. Cl.
USPC ............ 228/121; 228/122.1; 228/235.1; 419/5

(58) Field of Classification Search
None
See application file for complete search history.

(56) References Cited

U.S. PATENT DOCUMENTS

| | | | | |
|---|---|---|---|---|
| 5,164,220 A | * | 11/1992 | Caballero | 427/577 |
| 5,196,107 A | * | 3/1993 | Nakaoka et al. | 205/110 |
| 6,987,318 B2 | | 1/2006 | Sung | |
| 2005/0189647 A1 | * | 9/2005 | Sung | 257/720 |
| 2005/0250250 A1 | * | 11/2005 | Sung | 438/122 |
| 2005/0276979 A1 | * | 12/2005 | Slutz et al. | 428/408 |
| 2007/0298537 A1 | * | 12/2007 | Sung | 438/105 |
| 2008/0019098 A1 | * | 1/2008 | Sung | 361/706 |
| 2008/0171503 A1 | * | 7/2008 | Sung | 451/540 |
| 2008/0292869 A1 | * | 11/2008 | Sung | 428/323 |
| 2009/0283089 A1 | * | 11/2009 | Sung | 125/15 |
| 2010/0043304 A1 | * | 2/2010 | Lee et al. | 51/309 |
| 2010/0139174 A1 | * | 6/2010 | Sung | 51/297 |
| 2010/0208431 A1 | * | 8/2010 | Dugas et al. | 361/709 |
| 2010/0221990 A1 | * | 9/2010 | Sung | 451/540 |
| 2011/0024767 A1 | * | 2/2011 | Sung | 257/77 |
| 2011/0083835 A1 | * | 4/2011 | Chen et al. | 165/185 |
| 2011/0162751 A1 | * | 7/2011 | Fitzgerald et al. | 138/145 |
| 2011/0198771 A1 | * | 8/2011 | Hirotsuru et al. | 264/45.3 |
| 2011/0212670 A1 | * | 9/2011 | Sung | 451/56 |
| 2011/0293905 A1 | * | 12/2011 | Sung | 428/206 |
| 2011/0296766 A1 | * | 12/2011 | Sung | 51/297 |

FOREIGN PATENT DOCUMENTS

JP     10-000562 A  *  1/1998

* cited by examiner

*Primary Examiner* — Kiley Stoner
(74) *Attorney, Agent, or Firm* — Muncy, Geissler, Olds & Lowe, PLLC

(57) ABSTRACT

A thermal conduction device and a method for fabricating the same are disclosed. Firstly, arrange a plurality of diamond particles on a plane according to a predetermined pattern to form a diamond particle monolayer. Next, apply a forming process on a metal material such that the metal material forms a metal matrix wrapping the diamond particles to form a composite body including the diamond particle monolayer embedded in the metal matrix. Next, stack a plurality of the composite bodies and perform a heating process to join the metal matrixes to each other to form the thermal conduction device. The device is characterized in arranging diamond particles on a plane to form a two-dimensional monolayer structure and manufactured via assembling the two-dimensional monolayer structures to form a three-dimensional multilayer structure. By controlling the arrangement of the diamond particles, the thermal conduction device can have superior thermal conduction performance.

17 Claims, 18 Drawing Sheets

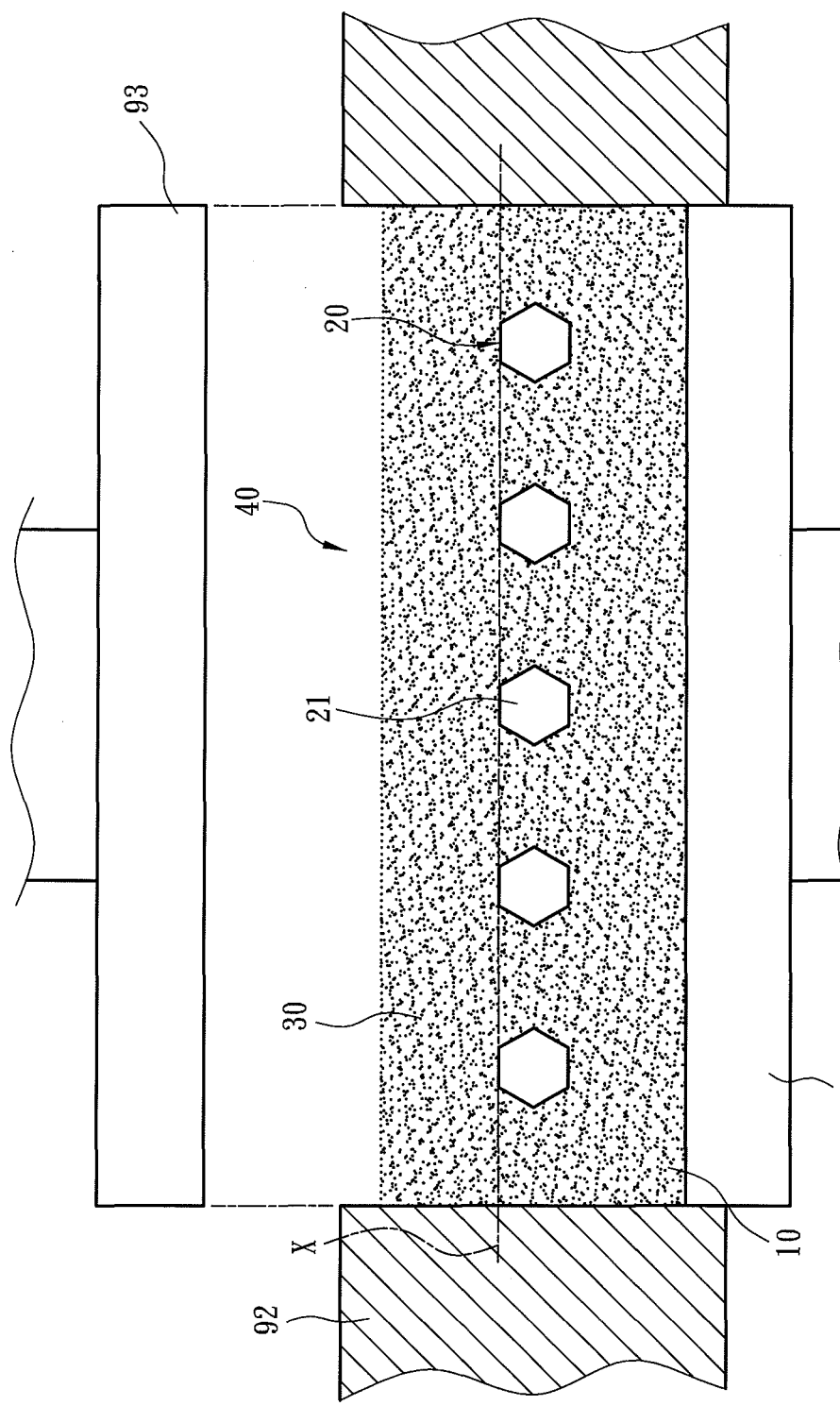

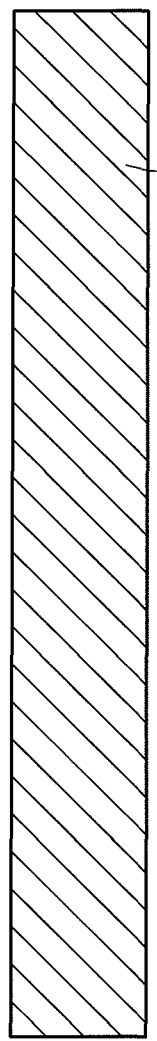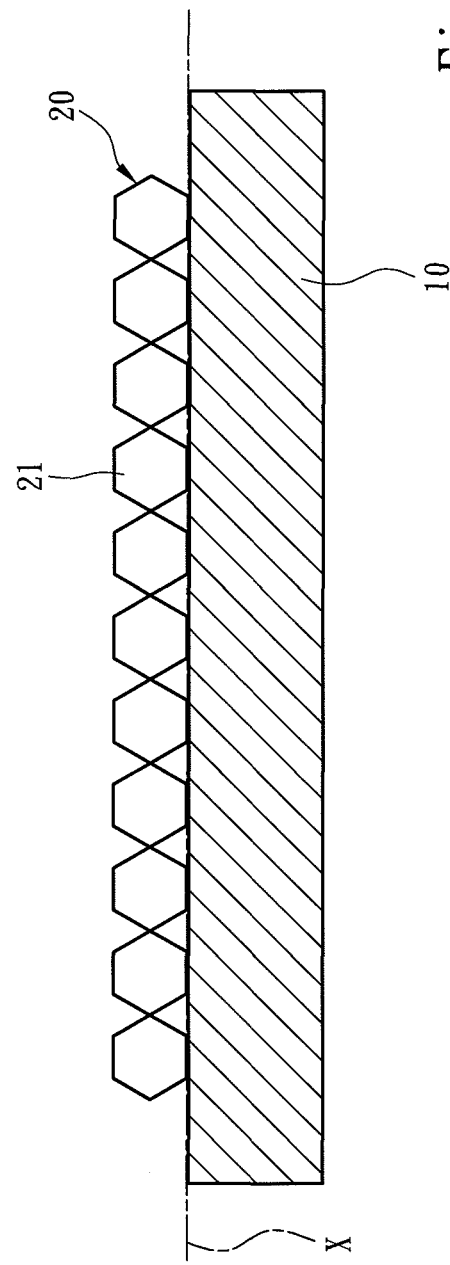

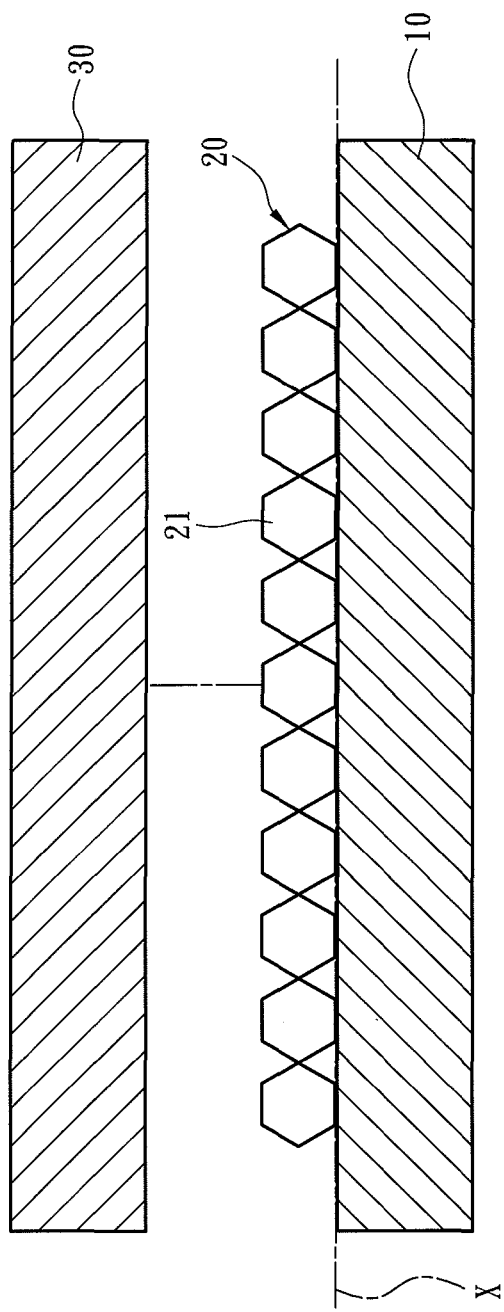
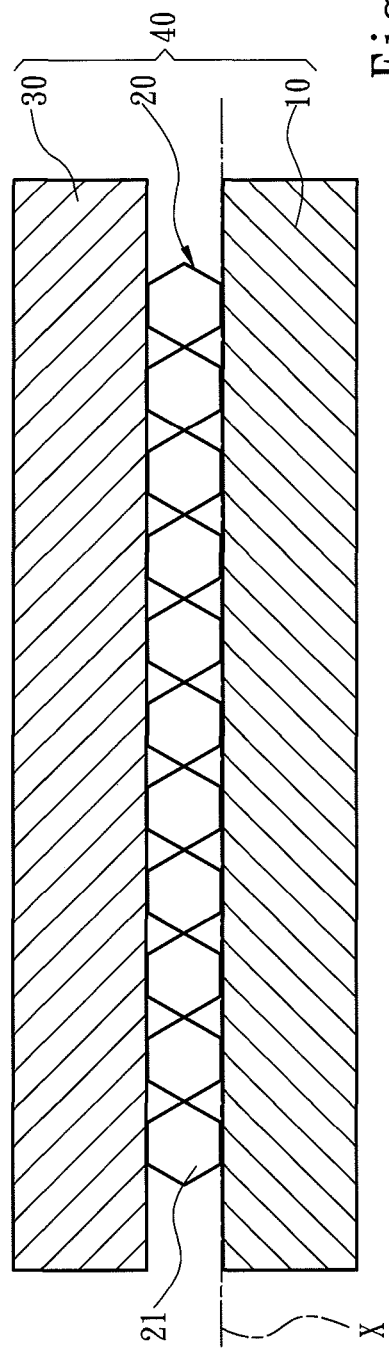

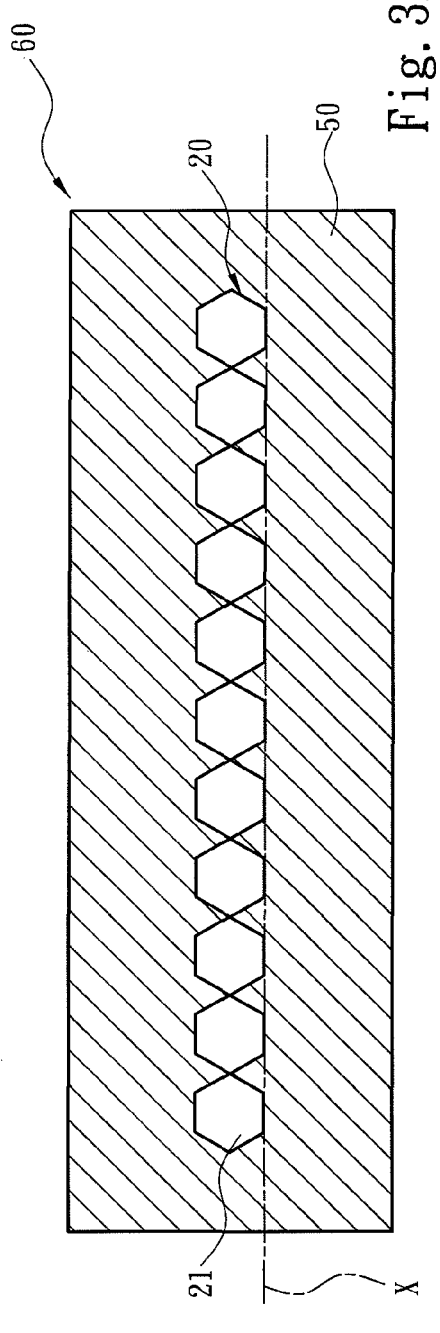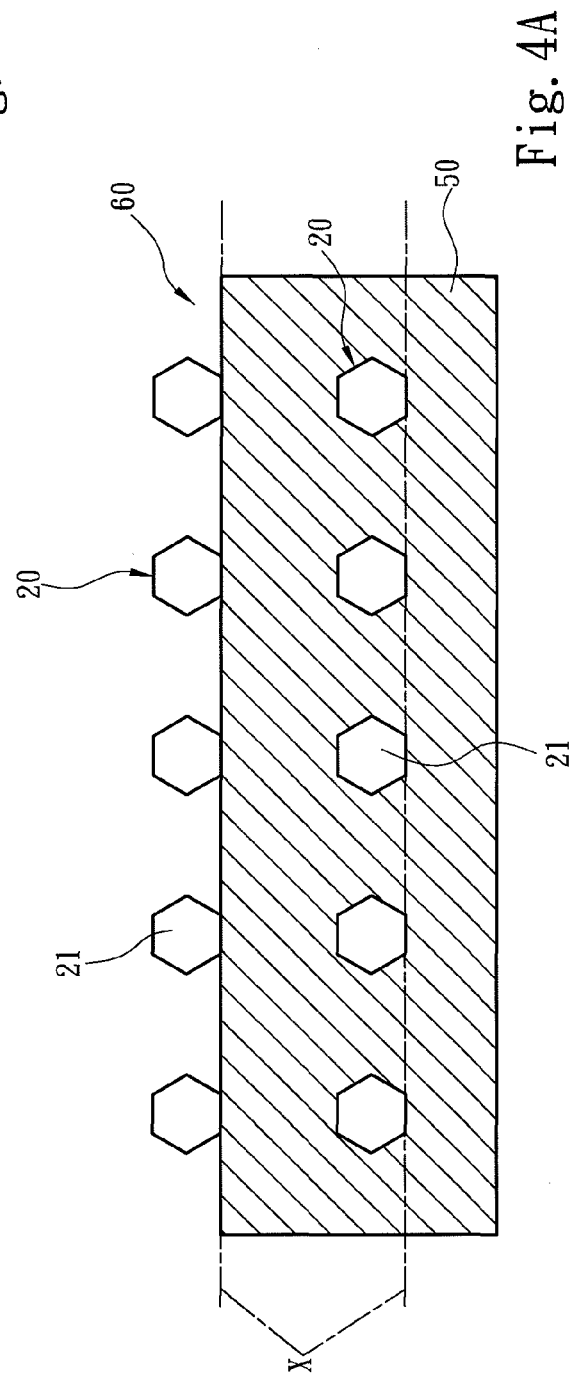

THERMAL CONDUCTION DEVICE AND METHOD FOR FABRICATING THE SAME

FIELD OF THE INVENTION

The present invention relates to a thermal conduction device and a method for fabricating the same, particularly to a method for fabricating a thermal conduction device, which can easily control arrangement of diamond particles in a metal matrix, and a thermal conduction device fabricated by the method.

BACKGROUND OF THE INVENTION

Thermal conduction has long been a critical factor influencing the performance and development direction of electronic products. For example, the chip of a computer usually carries a great quantity of transistors. Under the tendency of fabricating slim and lightweight electronic products, more and more transistors are crowded into smaller and smaller space, which makes heat hard to dissipate. LED (Light Emitting Diode) has been extensively applied to illumination recently. LED emits light with a great amount of heat generated simultaneously. If heat cannot be removed effectively, the service life of LED will be obviously shortened. Therefore, thermal conduction performance would influence the development of high power LED.

There have been many techniques developed to overcome the abovementioned thermal conduction problems of electronic products. Diamond materials have the advantages of high thermal conductivity and low thermal expansion coefficient. Therefore, manufacturers have paid much attention to develop thermal conduction devices containing diamond material. For example, U.S. Pat. No. 6,987,318 disclosed a diamond composite heat spreader having thermal conductivity gradients and associated methods. The heat spreader consists of diamond particles and a braze alloy wrapping the diamond particles, wherein the varied diamond concentration generates thermal conductivity gradient, and wherein the area near the heat source has higher thermal conductivity. Thereby, the consumption of diamond particles is reduced. In fabrication, diamond particles having different particle sizes are sequentially arranged in a mold, and an interstitial material is filled into the gaps. Then, the interstitial material and the diamond particles are integrated via sintering, diffusion or electrodeposition.

US patent publication No. US 2005/0189647 disclosed a carbonaceous composite heat spreader and associated methods, wherein graphite and diamond particles are distributed in an aluminum matrix. Graphite can increase isotropy of thermal conduction in the spreader. In fabrication, a graphite layer is placed in a mold, and then a layer of diamond grits is stacked over the graphite layer. The layer of diamond grits is formed via bonding diamond particles with a binder. The stacking of a graphite layer and the c is repeated several times. Then, molten aluminum or molten aluminum alloy is poured into the mold. After solidification, the heat spreader is obtained.

In U.S. Pat. No. 6,987,318, diamond particles are stacked in a three-dimensional structure beforehand. Next, the three-dimensional structure is placed in a mold, and the interstitial material is filled into the voids. However, the filling of the interstitial material is likely to alter the three-dimensional arrangement of diamond particles. Thus, performance of the heat spreader usually deviates from expectation. Besides, there is difference between the thermal expansion coefficients of the diamond particles and the filling material, which impairs the fabrication of a large-area heat spreader. In US patent publication No. US 2005/0189647, graphite layers and layers of diamond grits also need stacking in a three-dimensional structure in advance. Therefore, the same problem also occurs.

SUMMARY OF THE INVENTION

The primary objective of the present invention is to overcome the problems occurring in the conventional methods for fabricating a thermal conduction device, including the problem that arrangement of diamond particles is hard to control, the problem that difficult to control the desired thermal conductivity and the problem that difference between the thermal expansion coefficients of different materials impairs the fabrication of a large-size thermal conduction device.

To achieve the abovementioned objective, the present invention proposes a method of fabricating a thermal conduction device, which comprises steps:

(a) arranging a plurality of diamond particles on a plane according to a predetermined pattern to form a diamond particle monolayer;

(b) applying a forming process on a metal material such that the metal material forms a metal matrix wrapping the diamond particles to obtain a composite body containing the diamond particle monolayer embedded in the metal matrix; and (c) stacking a plurality of the composite bodies and applying a heating process to join the metal matrixes to each other.

Another objective of the present invention is to overcome the problem that poor arrangement of diamond particles makes thermal properties hard to control in the conventional thermal conduction device.

To achieve the abovementioned objective, the present invention further proposes a thermal conduction device, which comprises a metal matrix and a plurality of diamond particle monolayers, wherein the diamond particle monolayers are embedded in the metal matrix, and wherein each diamond particle monolayer includes a plurality of diamond particles arranged on a plane according to a predetermined pattern.

Compared with the conventional techniques, the thermal conduction device and the method for fabricating the same of the present invention have the following advantages:

1. The three-dimensional multilayer structure is formed via assembling a plurality of composite bodies each containing a two-dimensional diamond particle monolayer in the present invention. The thermal conductivity of the composite body can be controlled via modifying the arrangement of diamond particles in the diamond particle monolayers. Thereby, the thermal conduction device, which is formed via assembling together a plurality of composite bodies, can attain the desired thermal conductivity. For example, if the diamond particle facets having the maximum area are all oriented to an identical direction, the thermal conductivity will reach the maximum value in the direction.

2. The thermal expansion coefficients of the composite bodies can be adjusted to be within a narrow range via modifying the arrangement of diamond particles in the diamond particle monolayers. Thus, the difference of the thermal expansion coefficients between the diamond particles and the metal matrix would not restrict the final size of the thermal conduction device since the composite bodies can have similar values of thermal expansion coefficients. Therefore, the present invention favors fabrication of large-size thermal conduction devices.

3. Through varying the connection manner of the composite bodies, the structural design of the thermal conduction device is more flexible in the present invention.

BRIEF DESCRIPTION OF THE DRAWINGS

FIGS. 1A-1G are diagrams schematically showing the process of a method for fabricating a thermal conduction device according to a first embodiment of the present invention;

FIGS. 3A-3E are diagrams schematically showing the process of a method for fabricating a thermal conduction device according to a third embodiment of the present invention; and FIGS. 4A-4C are diagrams schematically showing the process of a method for fabricating a thermal conduction device according to a fourth embodiment of the present invention.

DETAILED DESCRIPTION OF THE PREFERRED EMBODIMENTS

Below are described in detail the technical contents of the thermal conduction device and the method for fabricating the same of the present invention.

Figure 1A:
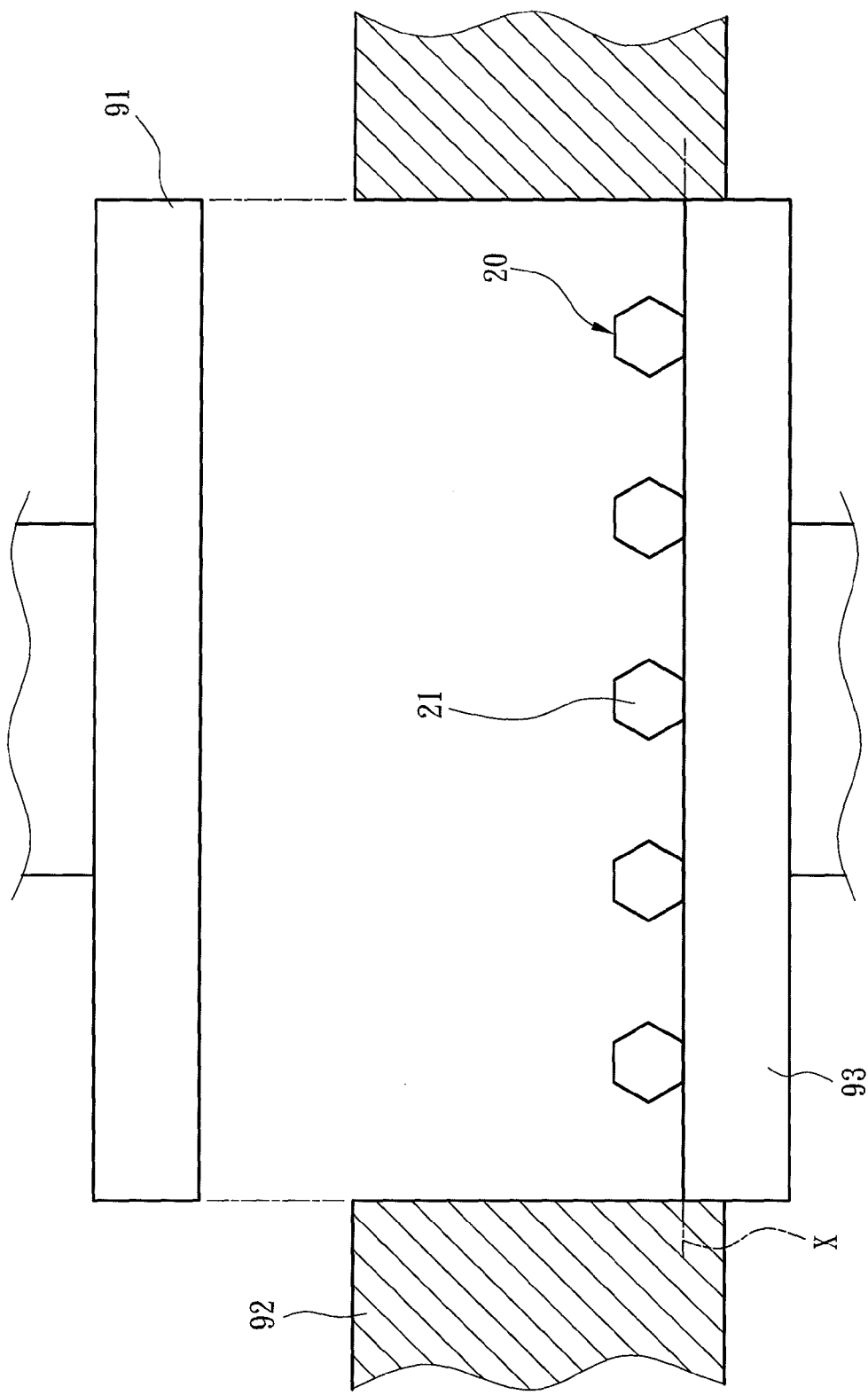

Refer to FIGS. 1A-1G diagrams schematically showing the process of a method for fabricating a thermal conduction device according to a first embodiment of the present invention. Firstly, arrange a plurality of diamond particles 21 on a plane X according to a predetermined pattern to form a diamond particle monolayer 20. In the beginning, provide a mold including an upper mold 91, a middle mold 92 and a lower mold 93. The diamond particles 21 are arranged on the plane X inside the mold to obtain the diamond particle monolayer 20. In this embodiment, the diamond particles 21 are arranged horizontally and equidistantly spaced by a first distance, as shown in FIG. 1A. However, the present invention does not limit that the diamond particles 21 are arranged in such a way. The diamond particles 21 may be arranged in another way according to practical design requirement. For example, the first distance is controlled to be zero to make the diamond particles 21 contact with each other and attain the closest horizontal arrangement. The diamond particles 21 have a diameter of 20-1000 μm. The first distance and the diameter of diamond particles 21 may be varied according to practical design requirement.

Figure 1B:
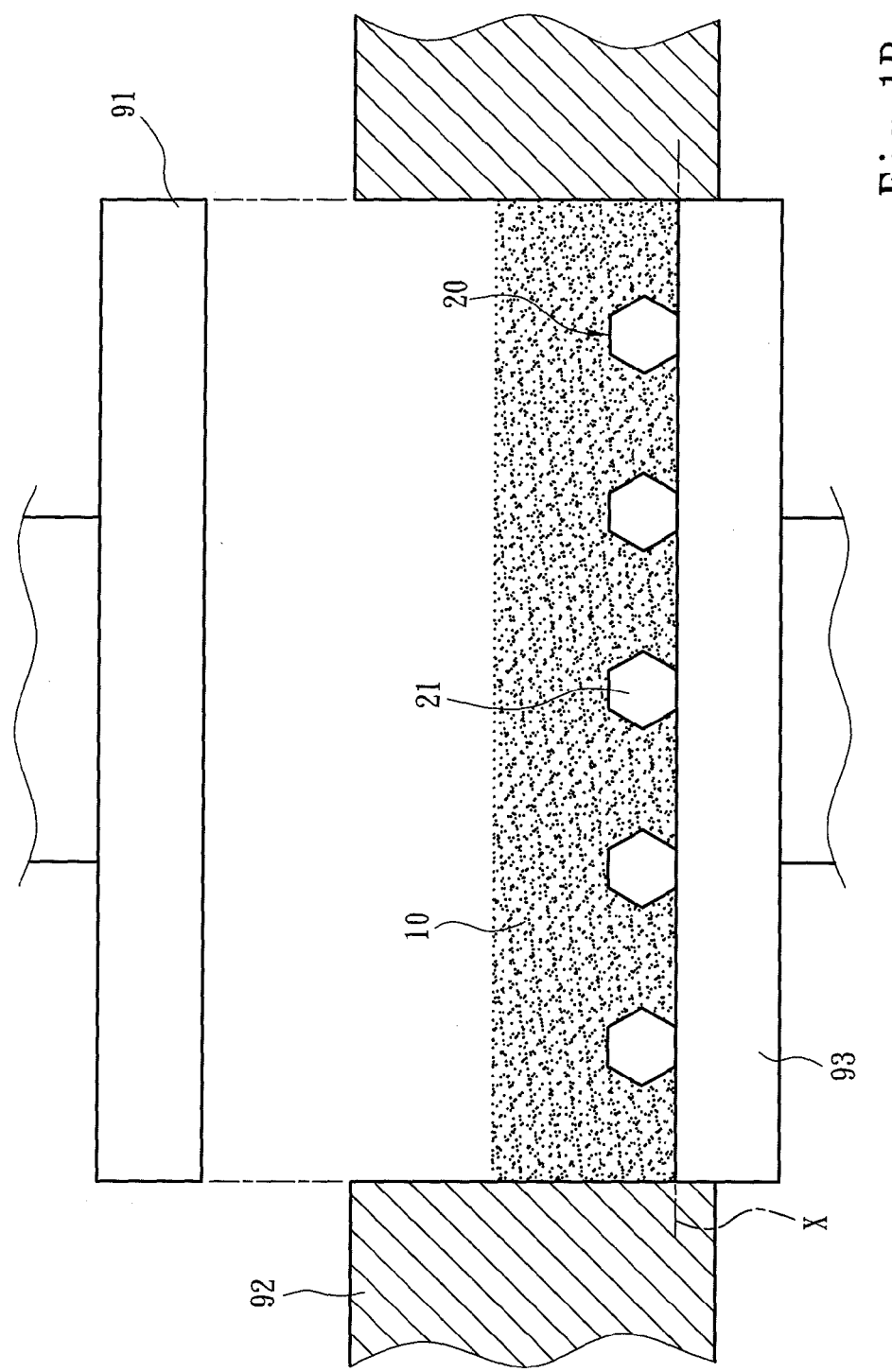
Figure 1C:
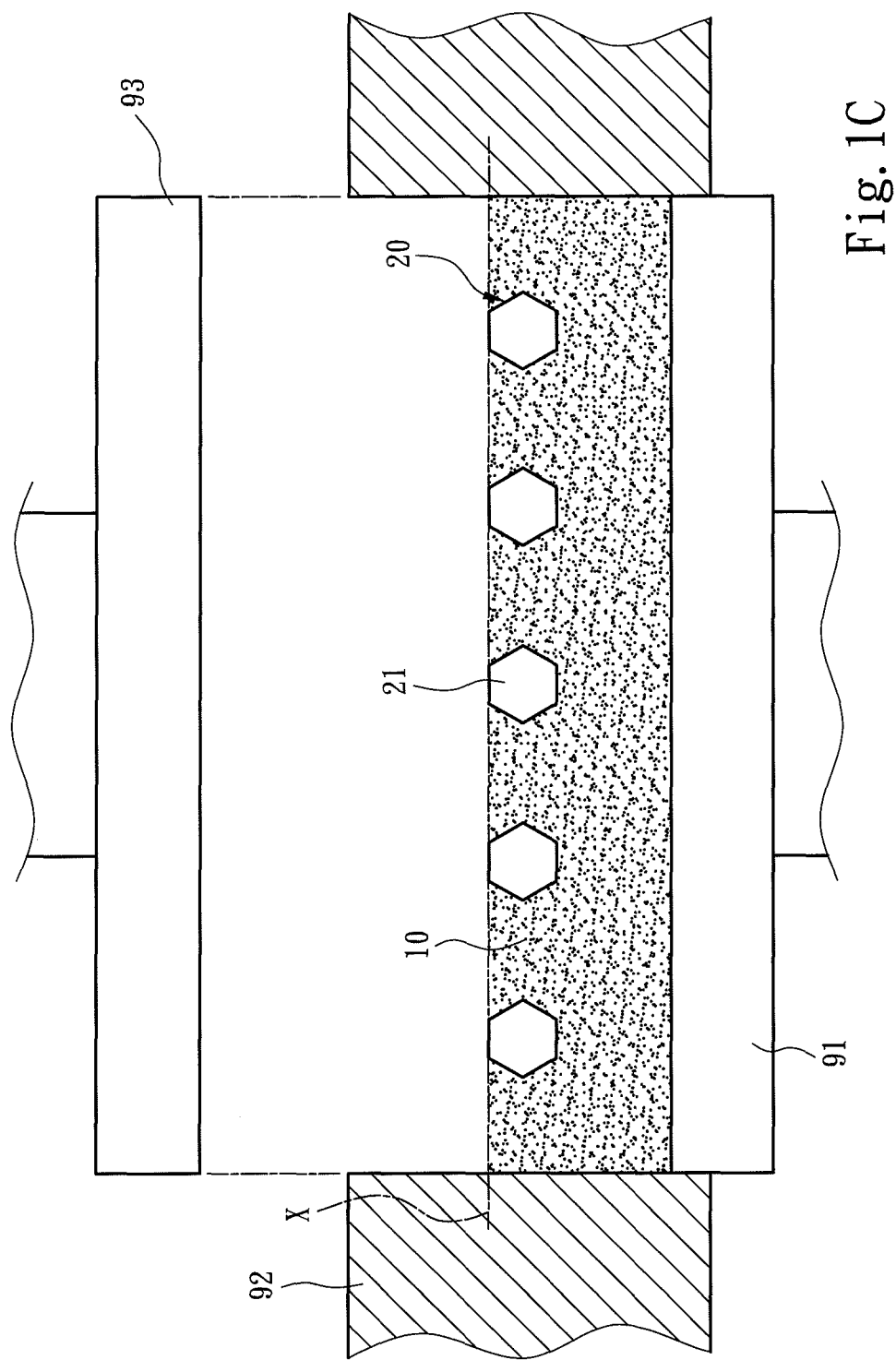

Next, cover one side of the diamond particle monolayer 20 with a first metal material 10, as shown in FIG. 1B. Following, use the upper mold 91 to perform a first pre-pressing step on the first metal material 10. Then flip over the mold and remove the lower mold 93, as shown in FIG. 1C. Next, place a second metal material 30 on another side of the diamond particle monolayer 20 to obtain a metal material 40 including the first metal material 10 and the second metal material 30, as shown in FIG. 1D. In this embodiment, both the first metal material 10 and the second metal material 30 are in form of metal powder made of an identical pure metal material, such as copper, aluminum, iron, cobalt, chromium, nickel, or an alloy thereof.

Figure 1E:
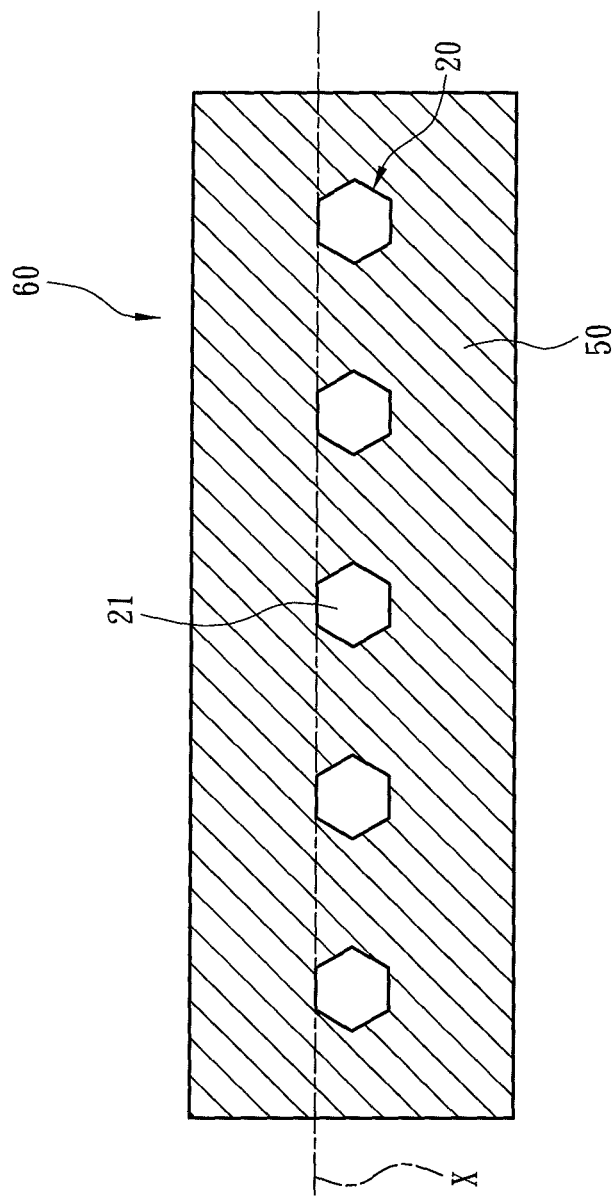

Next, apply a forming process on the metal material 40. The forming process may be a hot pressing process or a direct pressing process. The hot pressing process may be carried out in a vacuum environment or in a specified atmosphere with the metal material 40 being pressed by a load or by the mold. Alternatively, the hot pressing process may be realized with an SPS (Spark Plasma Sintering) process. Before the hot pressing process, a second pre-pressing step may be carried out with the upper mold 91 or the lower mold 93. In this embodiment, the forming process is realized with the SPS process at a temperature slightly lower than the melting point of the metal material 40. After the forming process, the metal material 40 forms a metal matrix 50 wrapping the diamond particles 21. Thus is obtained a composite body 60 with the diamond particle monolayer 20 maintained on the plane X and embedded in the metal matrix 50, as shown in FIG. 1E. In this embodiment, the metal material 40 has a thickness greater than that of the diamond particle monolayer 20 lest the diamond particles 21 outcrop from the metal matrix 50.

Figure 1F:
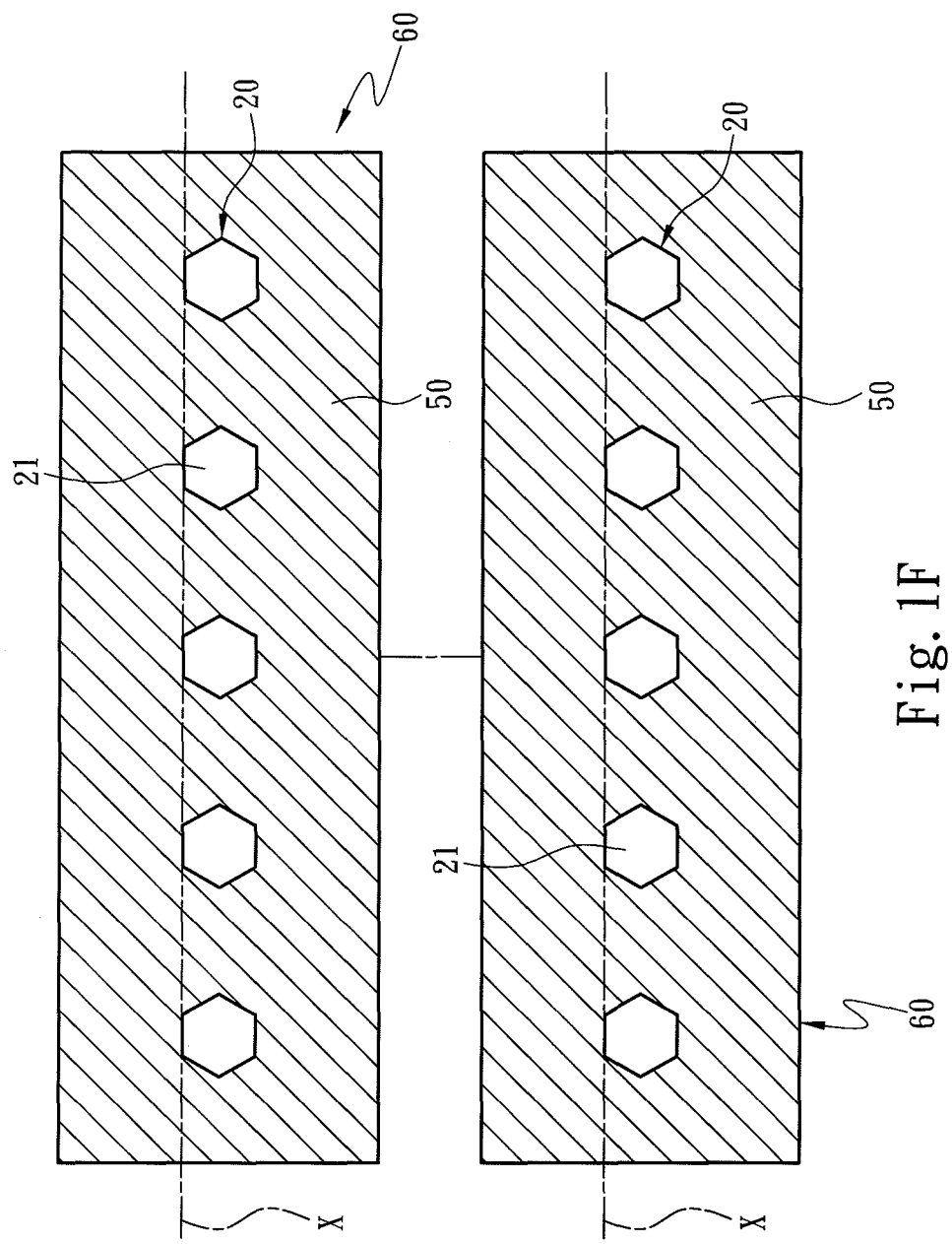

Next, stack up a plurality of the composite bodies 60. In this embodiment, one composite body 60 is stacked on the top of the other composite body 60, as shown in FIG. 1F. However, the present invention does not limit the number of the composite bodies 60 stacked together. Alternatively, the composite bodies 60 may be assembled edge by edge. Following, perform a heating process to join the metal matrixes 50. A pressing process may be undertaken simultaneously with the heating process. The heating process may be carried out in a vacuum environment or under a specified atmosphere. Alternatively, the heating process may be realized with an SPS process. In this embodiment, the heating process is carried out through the SPS process at a temperature slightly lower than the melting point of metal matrix 50.

Figure 1G:
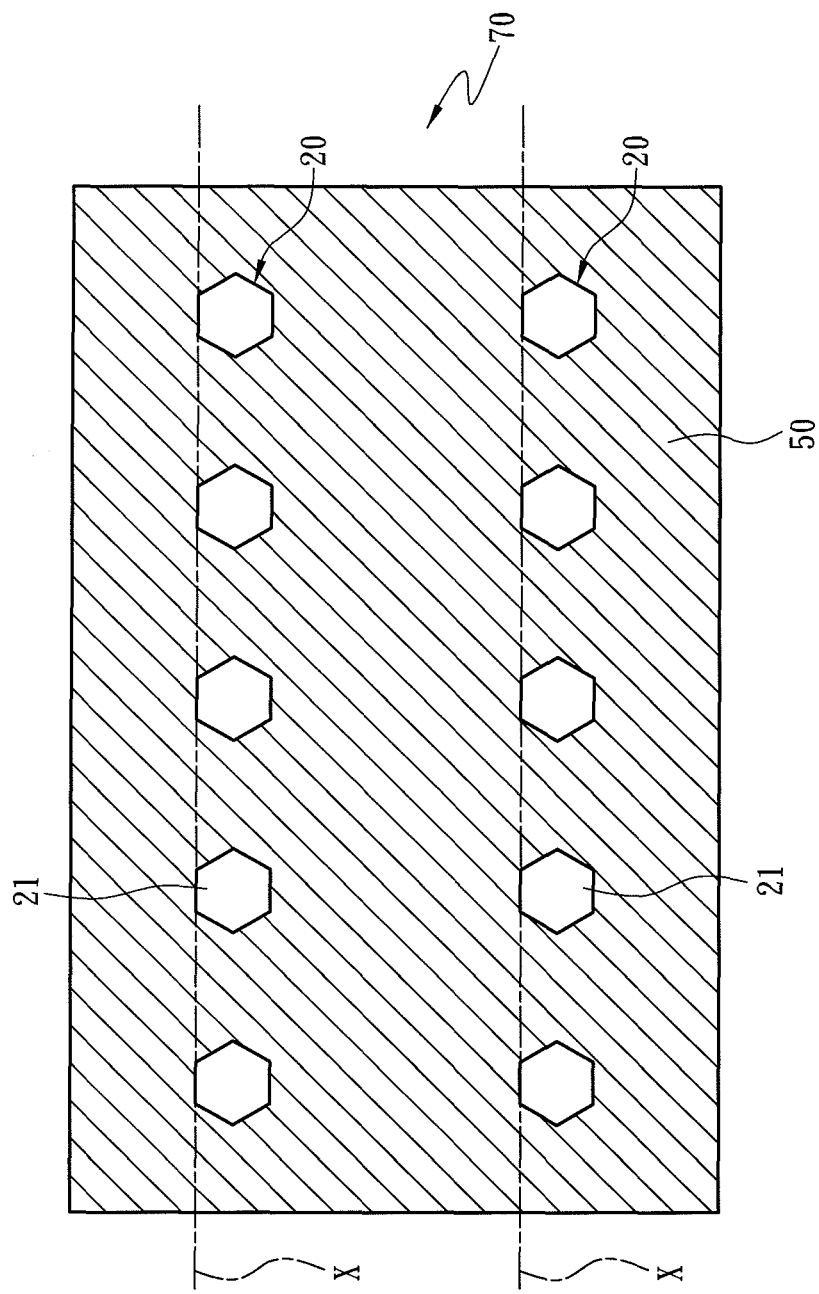

Refer to FIG. 1G. After the heating process, a thermal conduction device 70 including the metal matrix 50 and a plurality of the diamond particle monolayers 20 is obtained, wherein the diamond particle monolayers 20 are embedded in the metal matrix 50, and wherein the diamond particles 21 are arranged on the planes X and spaced by the first distance according to a predetermined pattern. Besides, two adjacent diamond particle monolayers 20 are vertically spaced by a second distance. In the present invention, the thermal conductivity of the thermal conduction device 70 is controlled to be 200-900 W/mk, and the thermal expansion coefficient is controlled to be 2-10 ppm/K. In the present invention, the diamond particles 21 have a volume percent of 20-70% with respect to the metal matrix 50, and 30-50% v/v is preferred.

In this embodiment, copper is used as the first metal material 10 and the second metal material 30; the SPS process is used as the forming process and the heating process is undertaken at a temperature of 900-1050° C. with a pressing pressure of 10-40 MPa. A sintering promoter may be added into the metal material 40 to improve joining of metal powder. The sintering promoter may be titanium, chromium, nickel, or a mixture thereof. The present invention does not restrict the fabrication parameters of the thermal conduction device, such as the sintering temperature, the temperature rising rate, the holding time, the atmosphere, the pressing pressure and the sintering promoter. The above-mentioned fabrication parameters depend on the metal material 40 and the quantity, arrangement and morphology of the diamond particles 21.

Figure 2A:
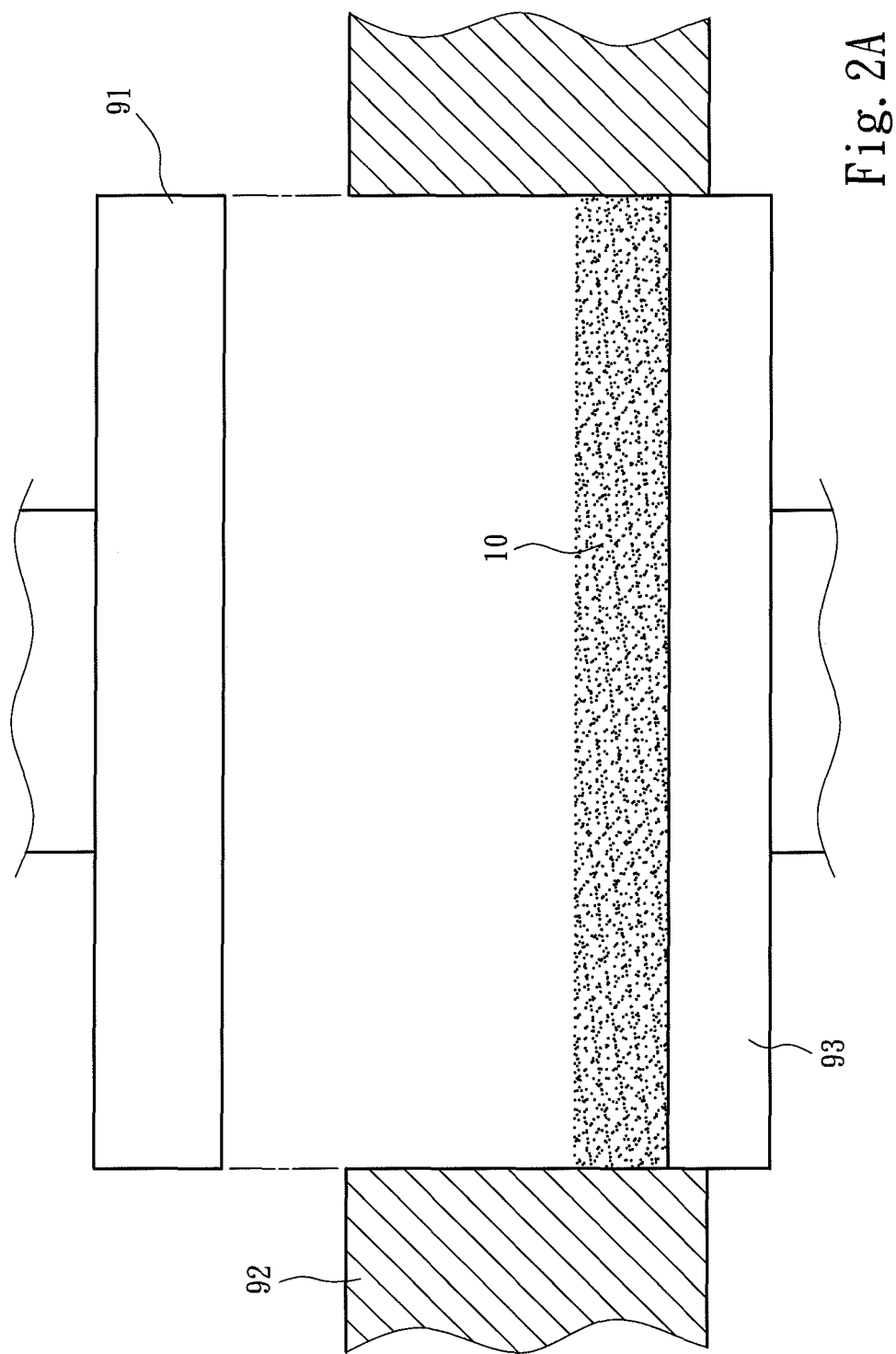
FIGS. 2A-2F are diagrams schematically showing the process of a method for fabricating a thermal conduction device according to a second embodiment of the present invention.
Figure 2B:
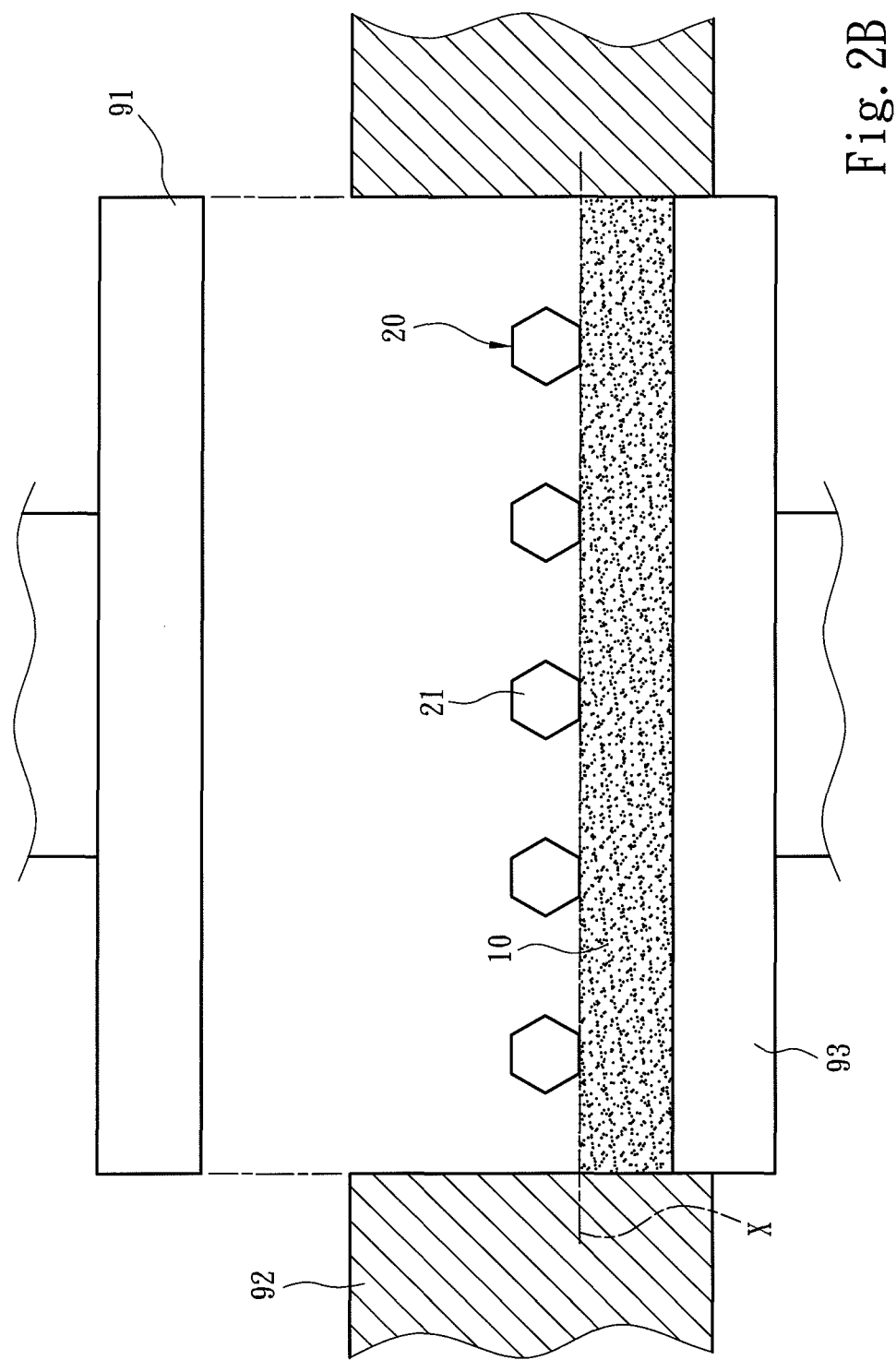
Figure 2C:
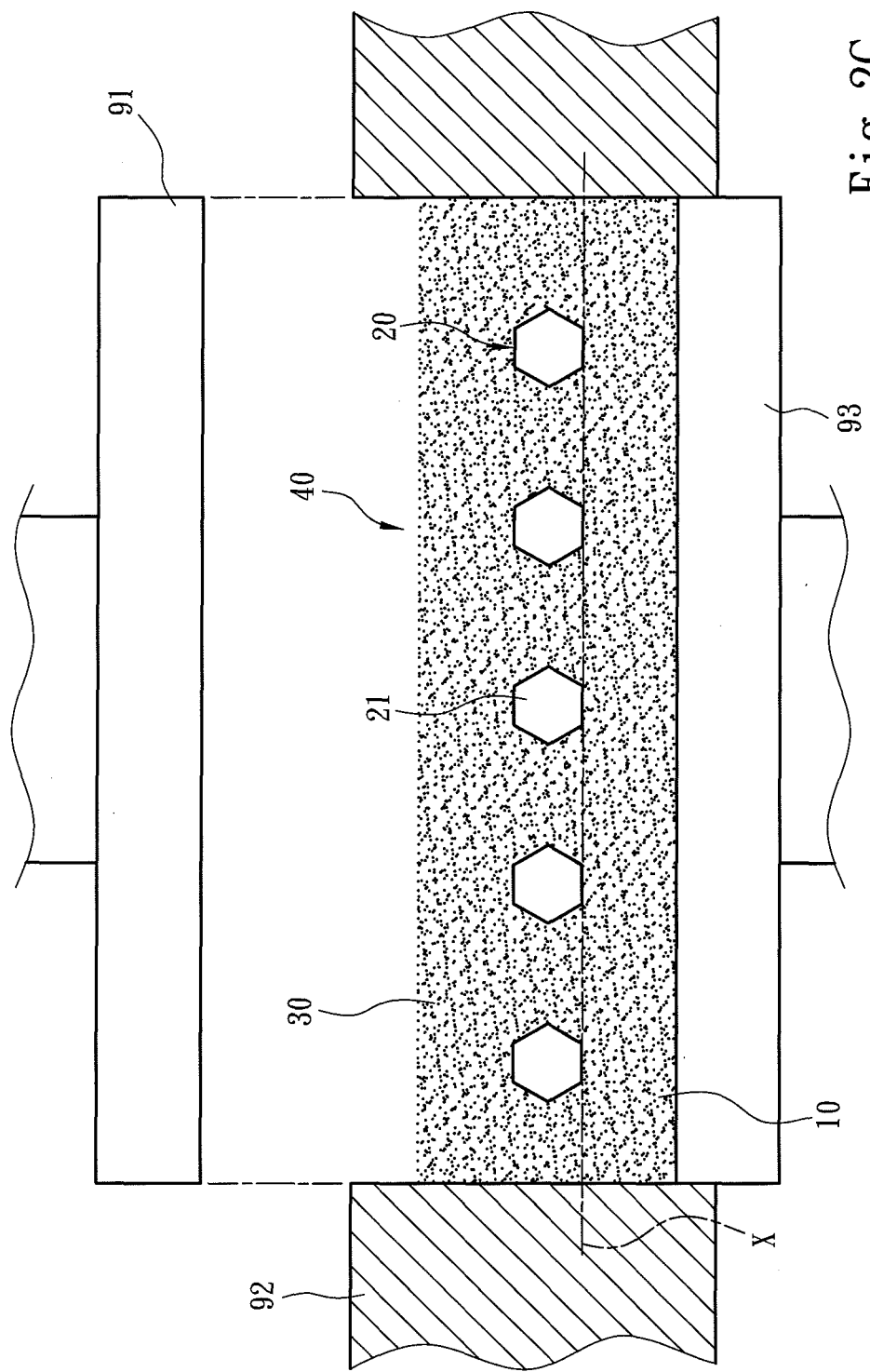

Refer to FIGS. 2A-2F diagrams schematically showing the process of a method for fabricating a thermal conduction device according to a second embodiment of the present invention. Firstly, place a first metal material 10 in a mold. The first metal material 10 is in form of metal powder. Next, arrange diamond particles 21 on the first metal material 10 with a first distance therebetween according to a predetermined pattern to form a diamond particle monolayer 20, as shown in FIG. 2B. In this embodiment, an adhesive layer is used to fix the diamond particles 21. The adhesive layer is made of PVA (or PVAC) (polyvinyl acetate), PEG (polyethylene glycol), or the like. Following, place a second metal material 30 on the diamond particle monolayer 20 to obtain a metal material 40 including the first metal material 10 and the second metal material 30, as shown in FIG. 2C. The second metal material 30 is also in form of metal powder. The first metal material 10 and the second metal material 30 are made of the same pure metal, such as copper, aluminum, iron, cobalt, chromium, nickel, or an alloy thereof, and copper is preferred.

Figure 2D:
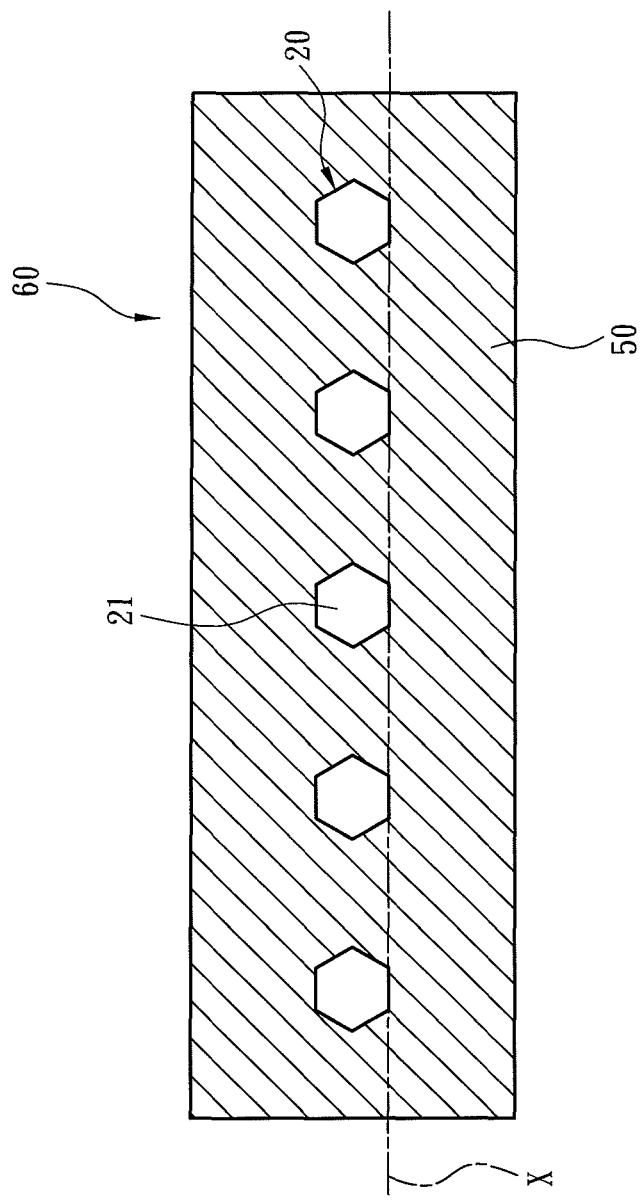
Figure 2E:
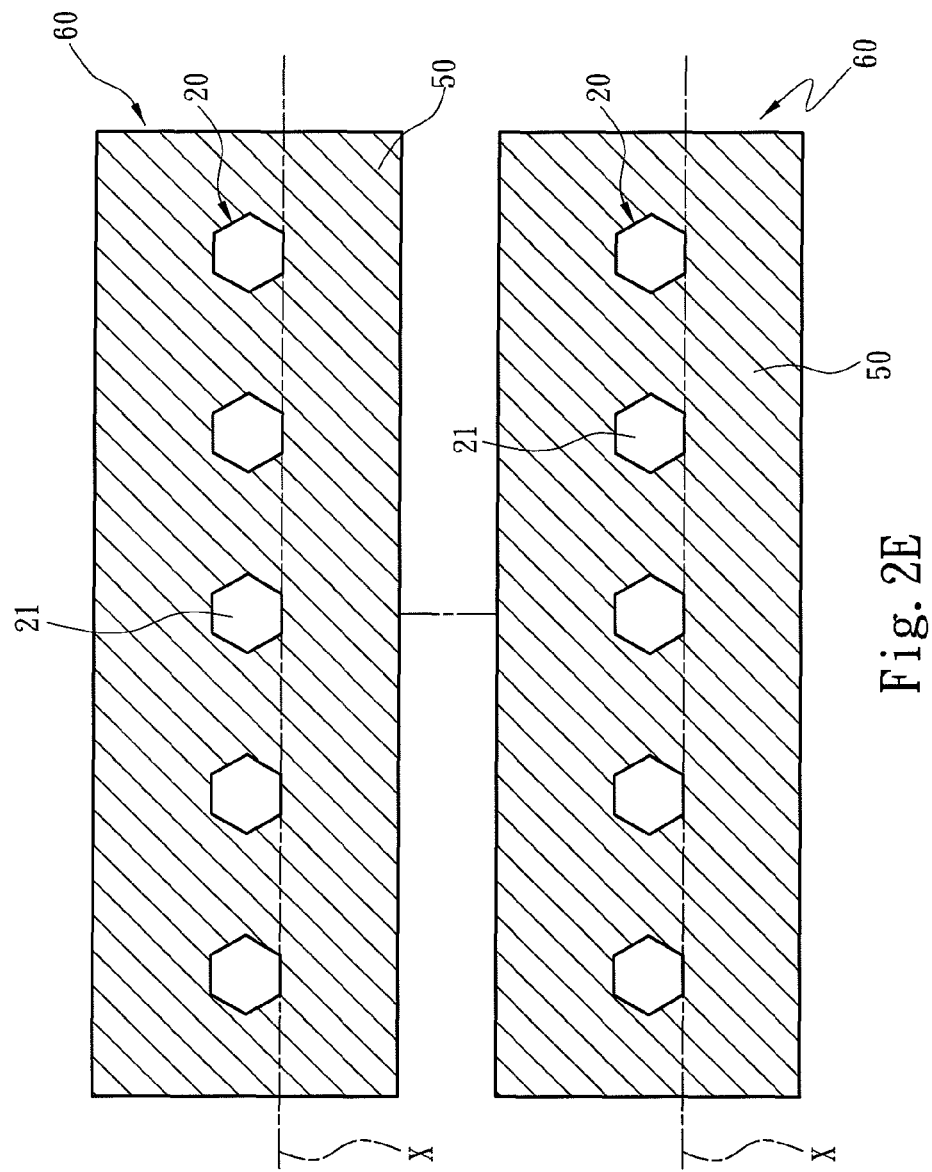
Figure 2F:
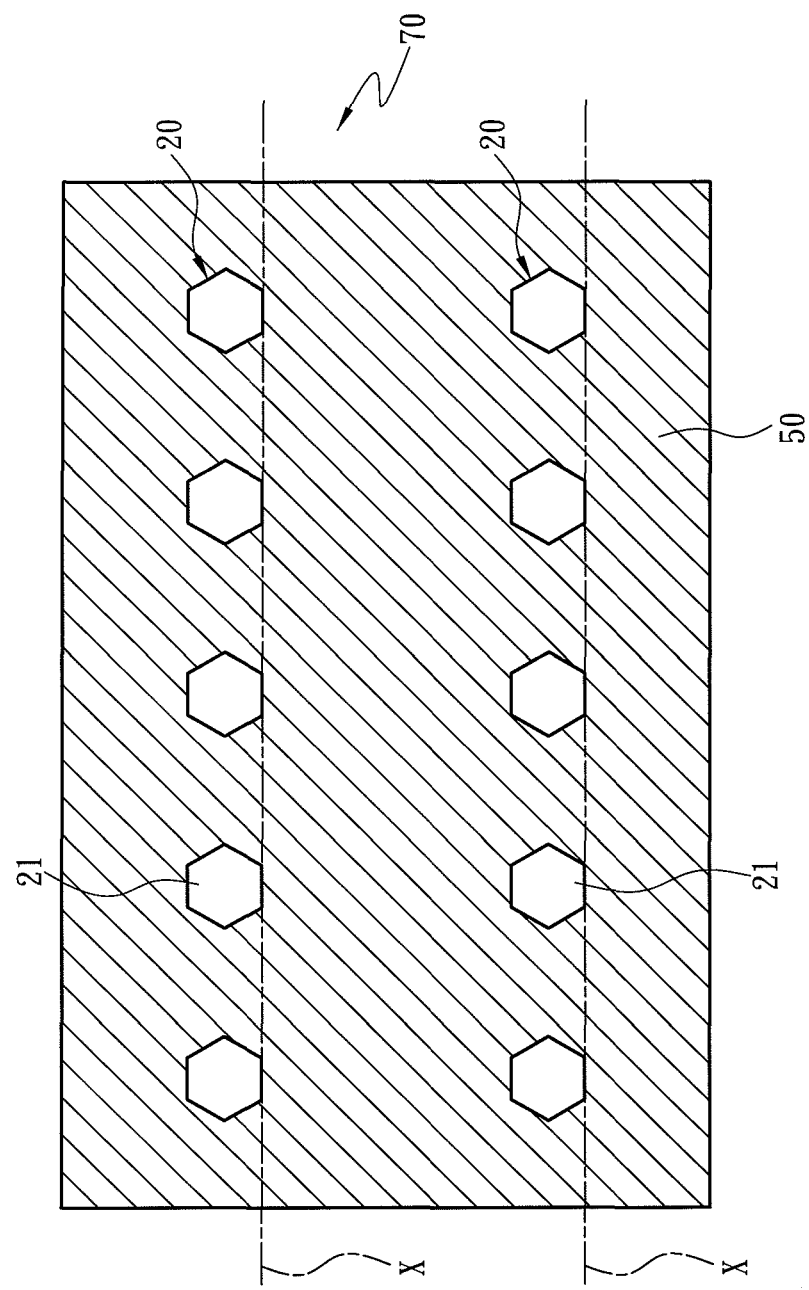

Next, perform a forming process to sinter the metal material 40 into a metal matrix 50. Next, remove the mold to obtain a composite body 60, as shown in FIG. 2D. Then, stack a plurality of the composite bodies 60, as shown in FIG. 2E. Following, perform a heating process to obtain a thermal conduction device 70, as shown in FIG. 2F. In the second embodiment, the SPS process is also used as the forming process and the heating process is carried out at a temperature slightly lower than the melting point of the metal material 40. In the second embodiment, a sintering promoter may be added into the metal material 40 to improve joining of metal powder. The sintering promoter may be titanium, chromium, nickel, or a mixture thereof. In the second embodiment, the second metal material 30 has a thickness greater than that of the diamond particle monolayer 20 lest the diamond particles 21 outcrop from the metal matrix 50.

Refer to FIGS. 3A-3E diagrams schematically showing the process of a method for fabricating a thermal conduction device according to a third embodiment of the present invention. In the third embodiment, both the first metal material 10 and the second metal material 30 are in form of a metal plate made of copper, aluminum, iron, cobalt, chromium, nickel, or an alloy thereof, and copper is preferred. Firstly, provide the first metal material 10. Next, place diamond particles 21 on the first metal material 10 such that the diamond particles 21 are arranged on a plane X according to a predetermined pattern to form a diamond particle monolayer 20. In the third embodiment, the diamond particles 21 contact with each other, as shown in FIG. 3B.

Next, place the second metal material 30 over the diamond particle monolayer 20 to obtain a metal material 40 including the first metal material 10 and the second metal material 30, as shown in FIG. 3C and FIG. 3D. In the third embodiment, the first metal material 10 and the second metal material 30 are made of the same metal, and copper is preferred. Next, apply a forming process on the metal material 40 such that the metal material 40 forms a metal matrix 50 to obtain a composite body 60 including the diamond particle monolayer 20 embedded in the metal matrix 50 with the diamond particles 21 maintained on the plane X, as shown in FIG. 3E. Next, similarly to the processes shown in FIG. 1F and FIG. 1G, stack a plurality of the composite bodies 60 and perform a heating process to join the metal matrixes 50 to each other. In the heating process, a pressing process may be carried out simultaneously. In the third embodiment, the SPS process is also used as the forming process and the heating process is undertaken at a temperature slightly lower than the melting point of the metal material 40.

Figure 4B:
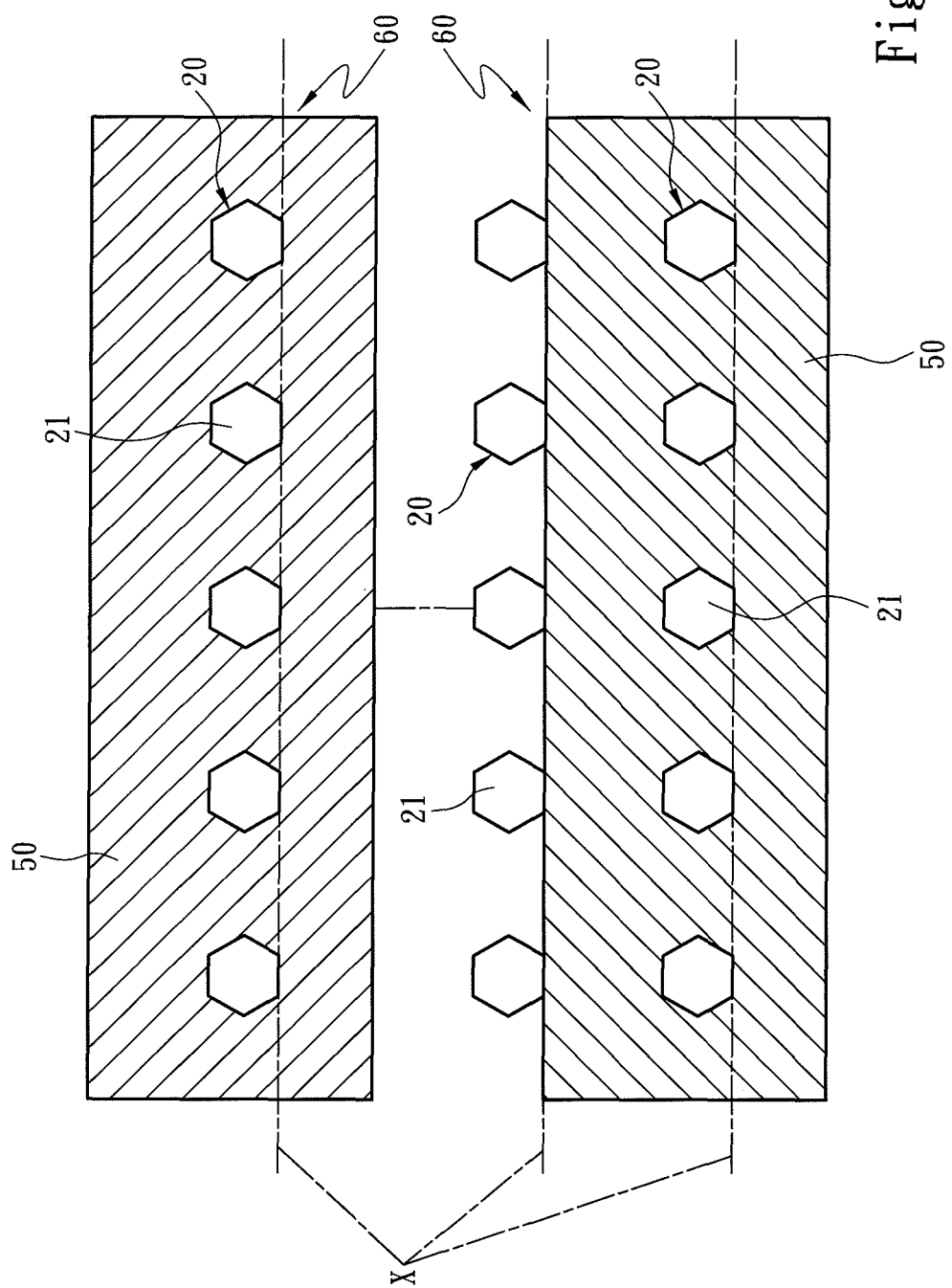
Figure 4C:
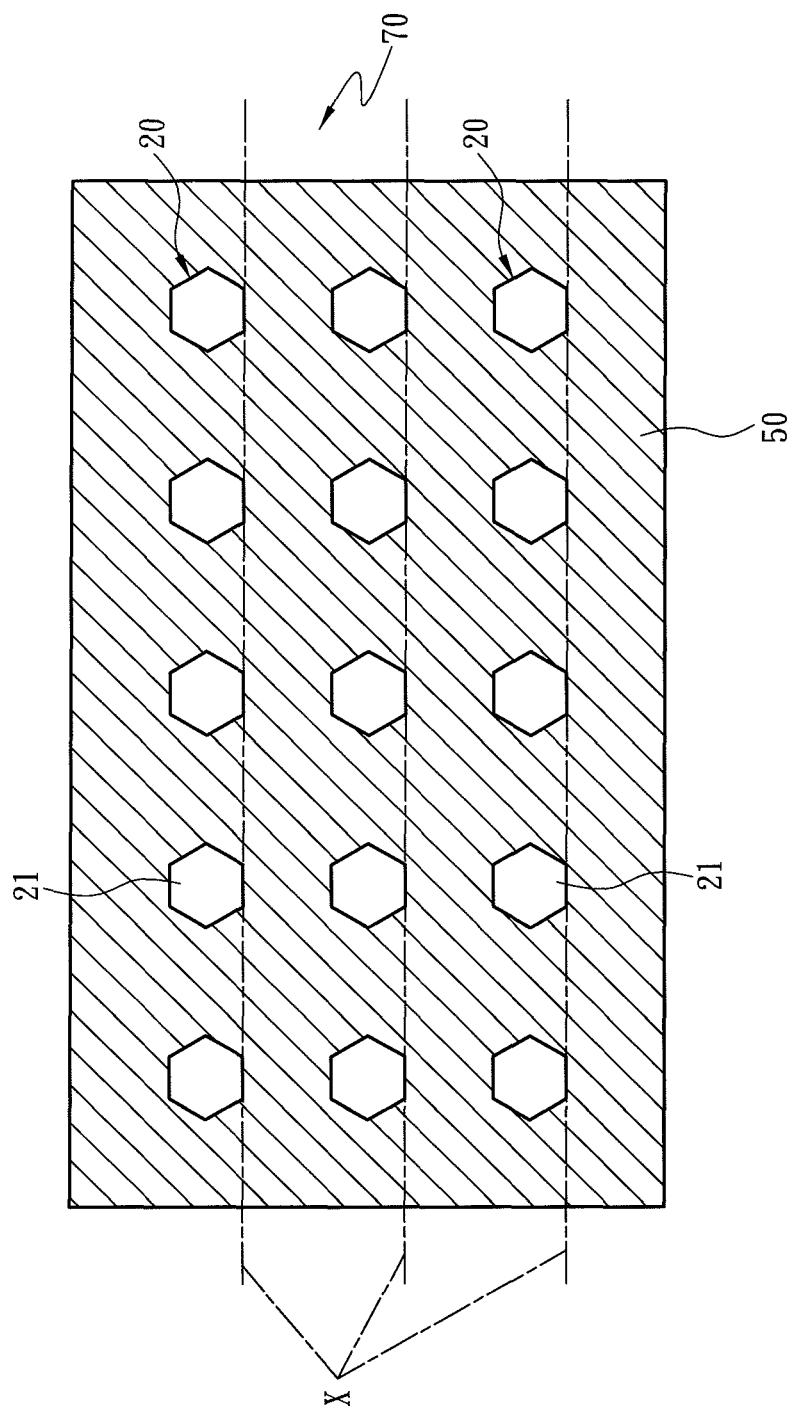

Refer to FIGS. 4A-4C diagrams schematically showing the process of a method for fabricating a thermal conduction device according to a fourth embodiment of the present invention. In the fourth embodiment, a diamond particle monolayer 20 is interposed between two composite bodies 60. Firstly, arrange diamond particles 21 on the surface of a composite body 60 according to a predetermined pattern to form a diamond particle monolayer 20, as shown in FIG. 4A. Next, stack another composite body 60 over the diamond particle monolayer 20, as shown in FIG. 4B. Then perform a heating process to obtain a thermal conduction device 70, as shown in FIG. 4C.

In conclusion, the thermal conduction device and the method for fabricating the same of the present invention are characterized in arranging diamond particles on a plane to form a two-dimensional monolayer structure and assembling the two-dimensional monolayer structures to form a three-dimensional multilayer structure. The configuration, volume and spacing of diamond particles can be more easily obtained via arranging diamond particles to form the diamond particle monolayer. Therefore, the present invention adjusts the related parameters (i.e. configuration, volume and spacing) in diamond particle monolayers in advance and then assembles the composite bodies containing the diamond particle monolayers to obtain a thermal conduction device with the thermal conductivity thereof being accurately controlled to achieve an optimized heat conduction performance. In one embodiment, the hexoctahedron diamond particles are arranged to let the facets having the greatest area face toward a same direction (such as toward a heat source) to make the thermal conduction device have a higher thermal conductivity in a specified direction.

Further, the present invention can respectively adjust the thermal expansion coefficients of the composite bodies to reduce difference of the thermal expansion coefficients between the composite bodies, whereby the composite bodies can be more easily joined to fabricate a large-size thermal conduction device. Furthermore, the present invention can join the composite bodies in various ways to diversify the design of thermal conduction devices.

The embodiments described above are only to exemplify the present invention but not to limit the scope of the present invention. Any equivalent modification or variation according to the spirit of the present invention is to be also included within the scope of the present invention.

What is claimed is:

1. A method for fabricating a thermal conduction device, comprising:

Step (a): arranging a plurality of diamond particles on a plane according to a predetermined pattern to form a diamond particle monolayer;

Step (b): applying a forming process on a metal material such that the metal material forms a metal matrix wrapping the diamond particles to obtain a composite body containing the diamond particle monolayer embedded in the metal matrix; and Step (c): stacking up a plurality of the composite bodies, and applying a heating process to join the metal matrixes to each other;

wherein in Step (a), the diamond particles are arranged inside a mold to form the diamond particle monolayer, and wherein there are further two steps between Step (a) and Step (b), including:

Step (d): placing a first metal material inside the mold to cover one side of the diamond particle monolayer; and Step (e): flipping over the mold and placing a second metal material inside the mold to cover another side of the diamond particle monolayer and obtain the metal material including the first metal material and the second metal material.

2. The method for fabricating a thermal conduction device according to claim 1 further comprising a first pre-pressing step between Step (d) and Step (e).

3. The method for fabricating a thermal conduction device according to claim 1, wherein the metal material is selected from a group consisting of copper, aluminum, iron, cobalt, chromium and nickel.

4. The method for fabricating a thermal conduction device according to claim 1, wherein the first metal material and the second metal material are in form of metal powder.

5. The method for fabricating a thermal conduction device according to claim 1, wherein a sintering promoter is added to the metal material.

6. The method for fabricating a thermal conduction device according to claim 5, wherein the sintering promoter is selected from a group consisting of titanium, chromium, and nickel.

7. A method for fabricating a thermal conduction device, comprising:
   Step (a): arranging a plurality of diamond particles on a plane according to a predetermined pattern to form a diamond particle monolayer;
   Step (b): applying a forming process on a metal material such that the metal material forms a metal matrix wrapping the diamond particles to obtain a composite body containing the diamond particle monolayer embedded in the metal matrix; and
   Step (c): stacking up a plurality of the composite bodies, and applying a heating process to join the metal matrixes to each other;
   wherein in Step (a), the diamond particles are arranged on a first metal material to form the diamond particle monolayer, and wherein between Step (a) and Step (b) is further interposed Step (f): placing a second metal material over the diamond particle monolayer to obtain the metal material including the first metal material and the second metal material.

8. The method for fabricating a thermal conduction device according to claim 7, wherein the first metal material and the second metal material are in form of metal powder or metal plates.

9. The method for fabricating a thermal conduction device according to claim 1, wherein the forming process is a hot pressing process or a direct pressing process.

10. The method for fabricating a thermal conduction device according to claim 1, wherein when the heating process is performed, a pressing process is applied on the composite body simultaneously.

11. The method for fabricating a thermal conduction device according to claim 1, wherein another diamond particle monolayer including the diamond particles is formed on one composite body, and then another composite body is stacked over the diamond particle monolayer.

12. The method for fabricating a thermal conduction device according to claim 1, wherein the diamond particles are horizontally spaced by a first distance.

13. The method for fabricating a thermal conduction device according to claim 1, wherein the diamond particles contact with each other.

14. The method for fabricating a thermal conduction device according to claim 1, wherein the metal material has a thickness greater than that of the diamond particle monolayer.

15. The method for fabricating a thermal conduction device according to claim 1, wherein the diamond particles have a diameter of 20-1000 μm.

16. The method for fabricating a thermal conduction device according to claim 1, wherein the diamond particles have a volume percent of 20-70% with respect to the metal matrix.

17. The method for fabricating a thermal conduction device according to claim 16, wherein the diamond particles have a volume percent of 30-50% with respect to the metal matrix.

* * * * *